United States Patent [19]

Tanaka

[11] Patent Number: 5,130,761
[45] Date of Patent: Jul. 14, 1992

[54] LED ARRAY WITH REFLECTOR AND PRINTED CIRCUIT BOARD

[75] Inventor: Toshiaki Tanaka, Yokohama, Japan

[73] Assignee: Kabushiki Kaisha Toshiba, Kawasaki, Japan

[21] Appl. No.: 729,560

[22] Filed: Jul. 15, 1991

[30] Foreign Application Priority Data

Jul. 17, 1990 [JP] Japan .................... 2-188441

[51] Int. Cl.$^5$ .................................. H01L 33/00
[52] U.S. Cl. ............................ 357/17; 357/74; 357/75; 357/76; 357/72; 357/45; 362/800; 362/296; 362/300; 362/301; 313/500; 313/512; 355/67; 355/70
[58] Field of Search ............... 357/45, 17, 72, 74, 357/76, 75, 74 A, 74 B, 74 C, 74 R, 17 L, 19, 51; 313/500, 512; 362/800, 296, 301, 300, 372; 355/67, 70

[56] References Cited

U.S. PATENT DOCUMENTS

| 4,478,588 | 10/1984 | Lockard | 357/72 X |
| 4,814,667 | 3/1989 | Tanaka | 313/500 |
| 4,929,866 | 5/1990 | Murata et al. | 313/500 |
| 4,945,391 | 7/1990 | Yagoura et al. | 357/74 X |
| 4,989,930 | 2/1991 | Nakagawa et al. | 357/74 X |
| 4,995,687 | 2/1991 | Nagai et al. | 357/74 X |

FOREIGN PATENT DOCUMENTS

| 56-142657 | 11/1981 | Japan | 357/72 |
| 3316271 | 10/1984 | Japan | 357/19 |
| 61-194882 | 8/1986 | Japan | 357/72 L |

Primary Examiner—William Mintel
Attorney, Agent, or Firm—Foley & Lardner

[57] ABSTRACT

The LED array of this invention is constructed of a printed circuit board, a plurality of LED chips disposed linearly on the printed circuit board, each LED chip being capable of radiating a light beam, and a reflection member for reflecting the light beam from the LED chips and guiding the light beam outward of the LED array in the main illumination direction generally parallel to the surface of the board.

19 Claims, 7 Drawing Sheets

LED ARRAY WITH REFLECTOR AND PRINTED CIRCUIT BOARD

FIELD OF THE INVENTION

The present invention relates to an LED array suitable for use as an LED light source for facsimile machines, image scanners, or the like.

BACKGROUND OF THE INVENTION

FIGS. 7(a) and 7(b) show a conventional LED array 10. This LED array has a printed circuit board 1 made of glass epoxy resin on which a printed wiring (not shown) is formed. As seen from FIG. 7(a), a plurality of LED chips 2, 2, . . . are disposed linearly in the longitudinal direction of the LED array. Each LED chip 2 is bonded to the board 1 by conductive adhesive agent such as silver epoxy resin. More specifically, each LED chip 2 has electrode plates at the lower and upper surfaces thereof, and the lower electrode plate is bonded to the board 1 by conductive adhesive agent. The upper electrode plate of each LED chip 2 is connected to the printed wiring by a gold fine wire 2A. The gold wire 2A is bonded by using a wire bonding method or the like. Elongated reflection plates 3 and 3 made of white plastics are mounted facing each other, with the train of LED chips 2, 2, . . . being interposed therebetween. Light beams 4 radiated from the LED chips 2, 2, . . . are directed in the main illumination direction 5 perpendicular to the surface of the board 1. The LED chips 2, 2, . . . and reflection plates 3 and 3 are enclosed with a cover 6 having a lens unit 6a made of transparent plastics. Current limiting chip resistors 7 are fixed to the board 1 at positions outside of and along the cover 6, by using solder. The resistor 7 limits the current flowing to the LED chip 2. The LED chip 2 and resistor 7 are electrically connected by the printed wiring formed on the board 1. The reflection plates and cover 6 are fixedly mounted on the board, by inserting legs 3a, 3a, 6b into holes 1a of the board 1 and forming caulking portions 3b, 6c through thermal caulking, as particularly shown in FIG. 7(b).

FIG. 7(a), mounting holes indicated at 1B are used for mounting the LED array 10 within a casing of a bar code reader or the like.

A light beam 4 of the LED array is arranged to be radiated in the direction (main illumination direction) 5 perpendicular to the surface of the board 1. In other words, the surface of the board 1 is aligned to the plane perpendicular to the optical path of the light beam 4. The board 1 has various components mounted thereon. Accordingly, it is inevitable that the dimension of the board 1 becomes large more or less, essentially resulting in a large dimension of an apparatus which mounts such an LED. Attention should be paid so that the board 1 of the LED array built in an apparatus will not intercept a portion of the optical path. This leads to a large optical system and hence a large dimension of the apparatus.

FIGS. 8 and 9 show examples of apparatuses having a large dimension. FIG. 8 shows a part of a so called contact type sensor. Light beams 4 emanated from LED arrays 10 and 10 illuminate the surface 13 of an original. Reflected light beams 4A are received via a rod lens array (Selfoc Lens, merchandise name) by a CCD 12. This rod lens array 11 outputs an image of an inputted image while maintaining its scale. The contact type sensor shown in FIG. 8, particularly the LED arrays 10, cannot be mounted too near the surface 13 of the original because of the large dimension of the board 1, inevitably resulting in a large dimension of the apparatus.

FIG. 9 shows a part of a so-called lens condensing type sensor. A light beam 4 emanated from an LED array 10 illuminates the surface 13 of an original. The reflected light beam 4A is further reflected by a mirror 15 and applied via a lens 16 to a CCD 12. The lens condensing type sensor of FIG. 9, particularly the LED array 10, is required to be positioned where the optical path is not intercepted, inevitably resulting in a large dimension of the apparatus.

The aperture area of the reflection plate 3 of the conventional LED array 10 shown in FIG. 7 is set considerably large relative to the dimension of the LED chip 2, because of a margin of assembly precision necessary for the apparatus quality. As a result, the light beams 4 emanated from the LED chip and reflected by the reflection plates 3 and 3 include invalid light beams. Namely, as particularly shown in FIG. 10, a light beam 4A emanated from the LED chip 2, reflected by the reflection plate 3, and refracted by the lend unit 6A of the cover 6, does not reach within an effective illumination area 18, and becomes an invalid light beam, so that light from the LED chip 2 cannot be efficiently used.

Furthermore, if the main illumination direction is set to the direction perpendicular to the surface of the board 1, it is not possible to form a reflection surface at the back of the LED chip 2, being unable to expect efficient reflection.

FIGS. 11(a) and 11(b) show another example of a conventional LED array. FIG. 11(a) is a perspective view of this LED array, and FIG. 11(b) is a cross section taken along line A—A of FIG. 11(a). The difference of this example from that shown in FIG. 7 resides in a cylindrical lens 6A which is supported by a pair of reflection plates 3 and 3. The other arrangement is the same as that shown in FIG. 7, and like elements to those shown in FIG. 7 are represented by using identical reference numerals.

FIGS. 12(a) and 12(b) show still another example of a conventional LED array. In this example, a pair of reflection plates 3 and 3 holds a board 1 at its opposite lateral sides, and a pair of support pieces 1A and 1A holds the board 1 and reflection plates 3 and 3 at their opposite longitudinal sides. The pair of reflection plates 3 and 3 holds a lens 6A. The other arrangement is the same as that shown in FIG. 7, and like elements to those shown in FIG. 7 are represented by using identical reference numerals.

Similar to the LED array of FIG. 7, the LED arrays shown in FIGS. 11 and 12 radiate a light beam 4 in the direction perpendicular to the surface of the board 1. Accordingly, these LED arrays are also associated with the problems described with the LED array shown in FIG. 7.

In addition, as the integration degree of LED chips becomes high, the number of current limiting resistors essentially increases, so that the mount area for resistors becomes large.

Conventionally, an led array has used a single current limiting resistor for a plurality of LED chips. However, as the illumination requirements become very strict, each LED chip requires its own current limiting resistor, resulting in an increase of the mount area for current limiting resistors. Furthermore, the printed circuit board is mounted perpendicular to the main illumination direction. Therefore, as the area of the printed circuit board becomes large, it is hard to mount an LED array on a thin apparatus such as a bar code reader.

As described above, the main illumination direction of a light beam emanated from an LED chip of a conventional LED array is generally perpendicular to the board. Therefore, it is difficult to make small the area of an LED array on the surface of the board, and it is impossible to efficiently use a light beam emanated from an LED chip.

SUMMARY OF THE INVENTION

The present invention has been made in consideration of the above circumstances. It is an object of the present invention to provide an LED array capable of making the area of an LED array mounting apparatus small on the surface perpendicular to the main illumination direction of a light beam emanated from an LED chip, and efficiently using a light beam emanated from the LED chip.

An LED array of the present invention is constructed of a printed circuit board, a plurality of LED chips disposed linearly on the printed circuit board, each LED chip being capable of radiating a light beam, and a reflection member for reflecting the light beam from the LED chips and guiding the light beam outward of the LED array in the main illumination direction generally parallel to the surface of the board.

DETAILED DESCRIPTION OF THE PREFERRED EMBODIMENTS

Figure 1:
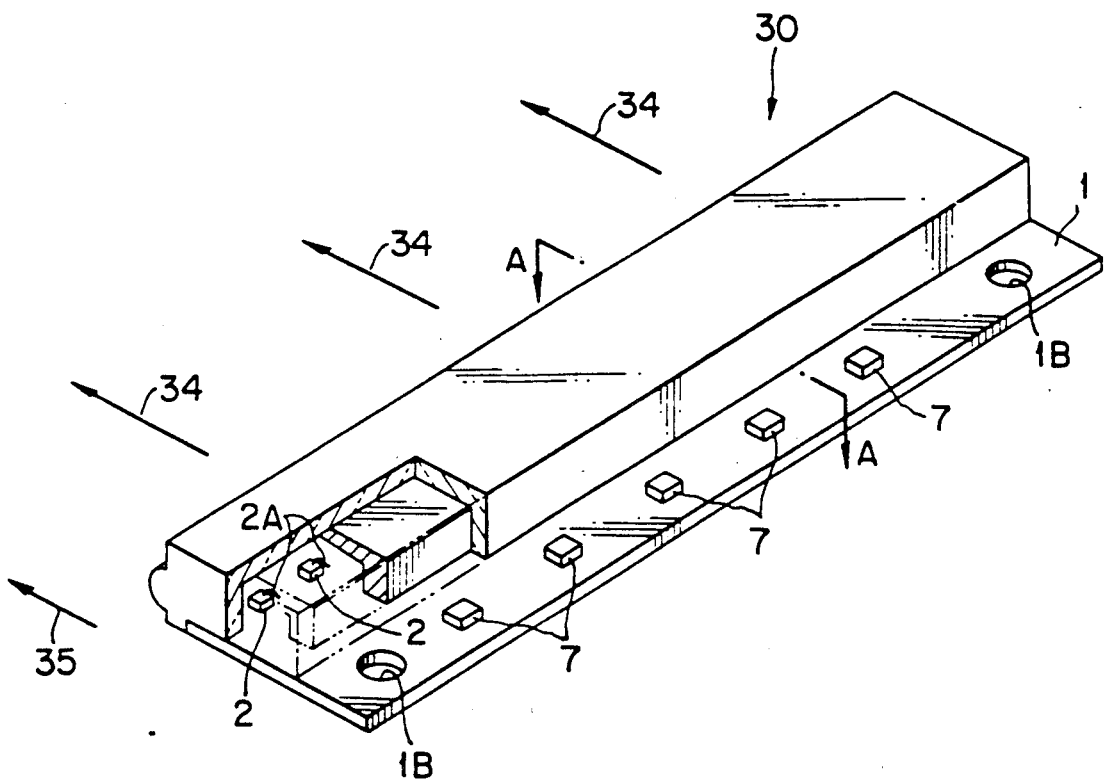
FIG. 1(a) is a partially broken perspective view of an LED array according to an embodiment of the present invention.
FIG. 1(b) is a cross section taken along line A—A of FIG. 1(a)
Figure 1:
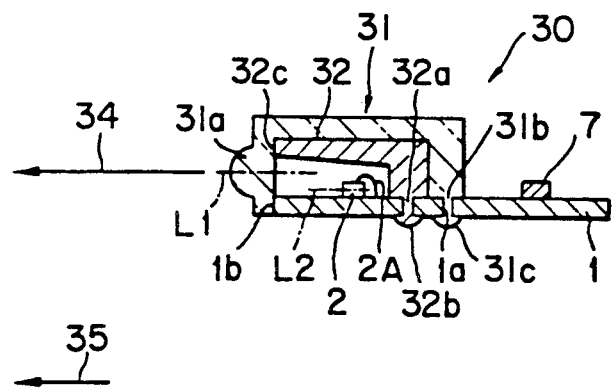
Figure 7A:
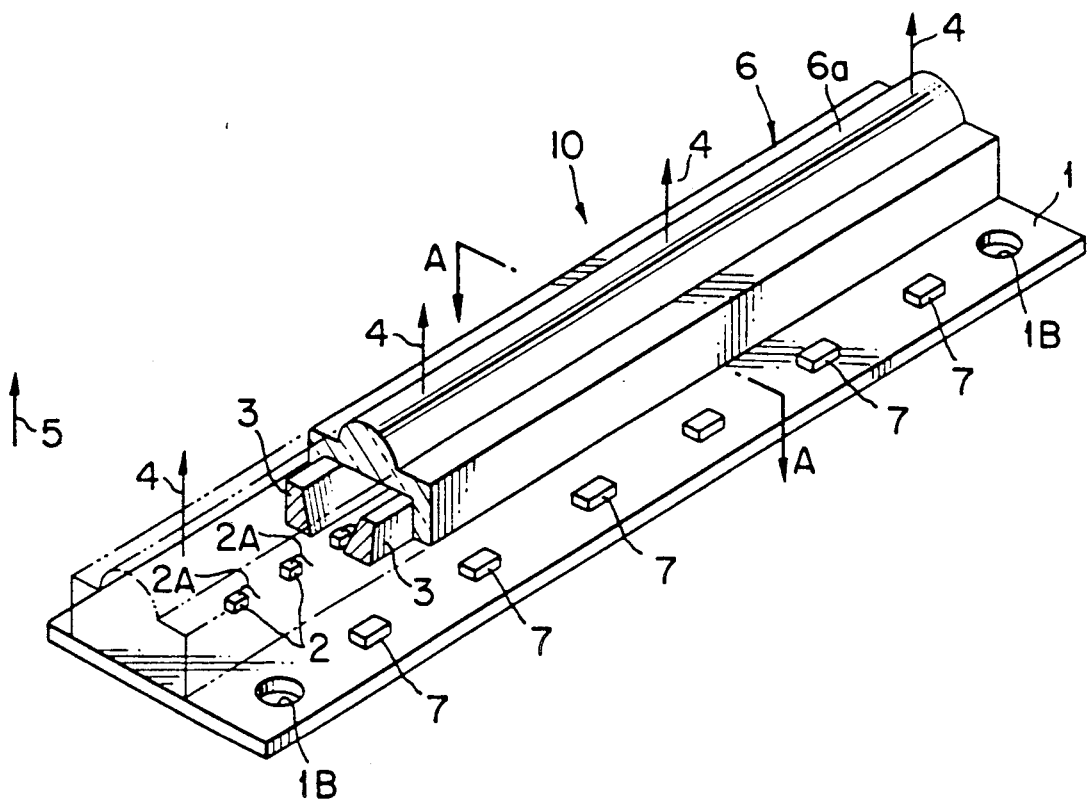
FIGS. 7(a) and 7(b) are a perspective view and a cross section of a conventional LED array.
Figure 7B:
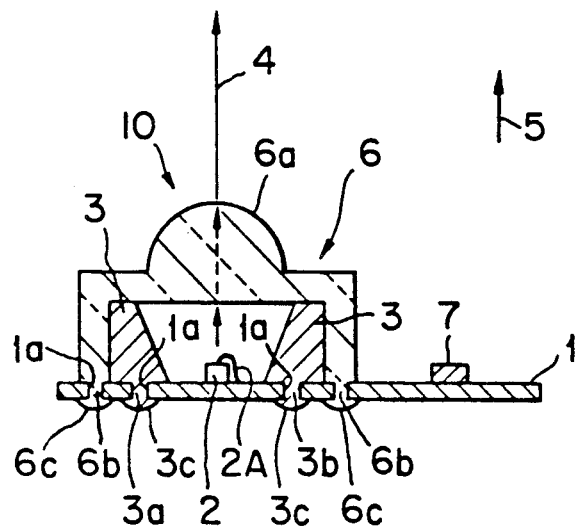
Figure 8:
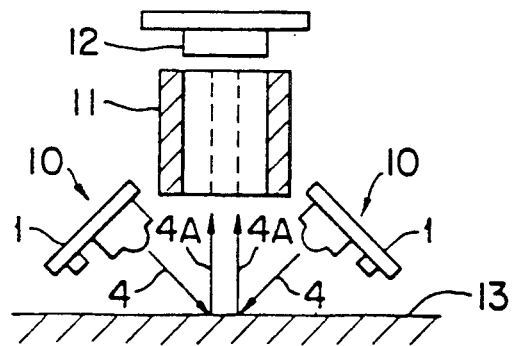
FIG. 8 shows a part of an apparatus mounting the LED arrays shown in FIGS. 7(a) and 7(b)
Figure 9:
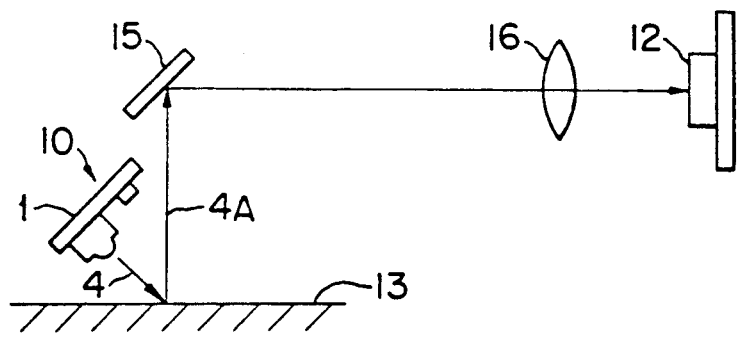
FIG. 9 shows a part of an apparatus mounting the LED array shown in FIGS. 7(a) and 7(b)
Figure 10:
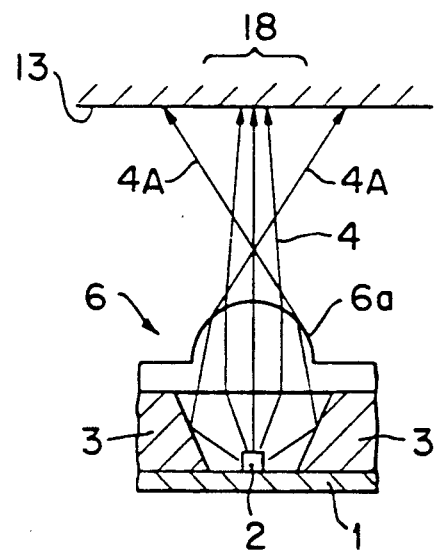
FIG. 10 illustrates the operation of the LED array shown in FIGS. 7(a) and 7(b)
Figure 11:
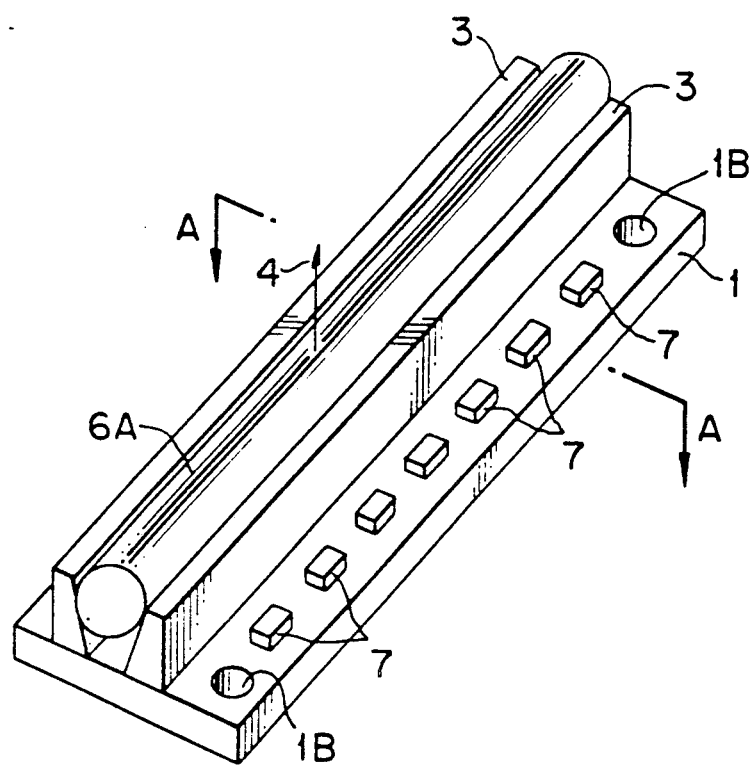
FIGS. 11(a) and 11(b) are a perspective view and a cross section of another conventional LED array.
Figure 11:
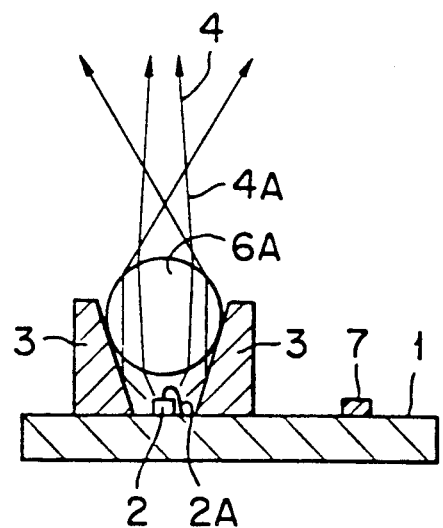
Figure 12:
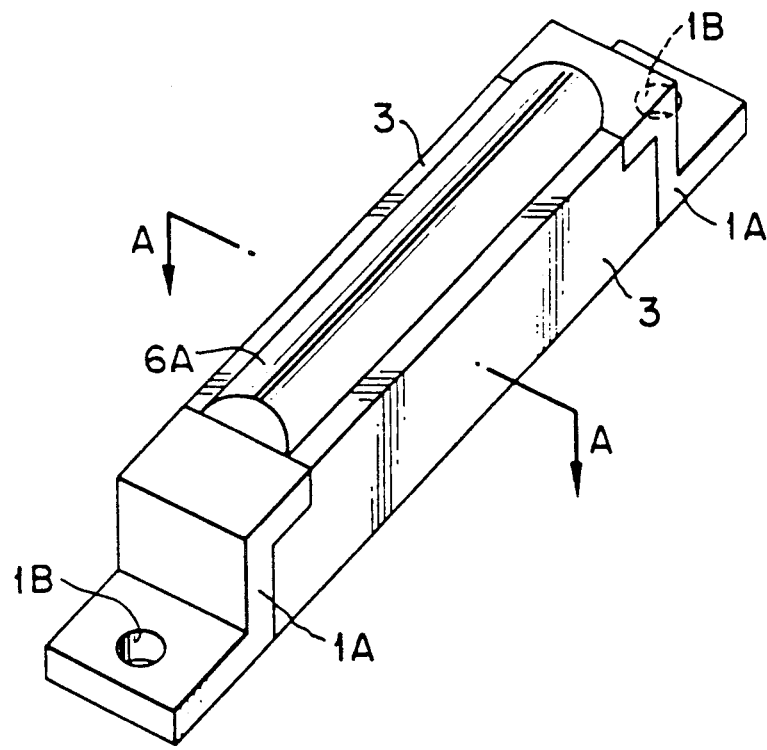
FIGS. 12(a) and 12(b) are a perspective view and a cross section of still another conventional LED array.
Figure 12:
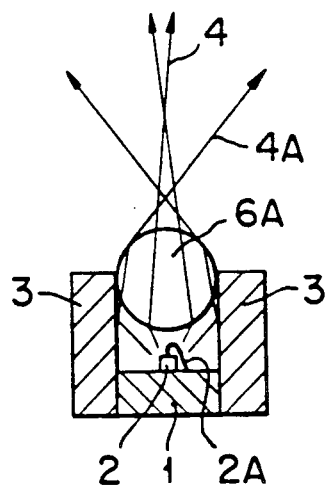

FIGS. 1(a) and 1(b) show an embodiment of an LED array according to the present invention. In FIGS. 1(a) and 1(b), like elements to those shown in FIGS. 7(a) and 7(b) are represented by using identical reference numerals. The difference of the LED array from that shown in FIGS. 7(a) and 7(b) resides in the structure of a reflection plate 32 and a cover 31. The other structure is the same as that shown in FIGS. 7(a) and 7(b).

Only a single reflection plate 32 is provided. The reflection plate 32 is formed in an elongated shape, and its lateral cross section is generally of an L-character shape. The reflection plate 32 reflects a light beam 34 from an LED chip 2 in a main illumination direction 35. The inner wall of the reflection plate 32 is formed approximately in a parabolic shape in cross section. The reflection plate 32 is bonded to a board 1 by inserting a leg 32a into a hole 1a of the board 1 and forming a caulking portion 32b through thermal caulking, in the manner similar to the case of the LED array shown in FIG. 7. The cover 31 is formed in an elongated shape, with the lower side thereof being exposed to thereby forming the cover generally in a channel shape. The cover 31 has a lens unit 31a on the side of the main illumination direction 35. The optical axis L1 of the lens unit 31a is displaced from an axis L2 of the LED chip 2. As a result, the lens unit 31a can guide a light beam having a sufficiently large light amount, in the main illumination direction 35. A leg 31b of the cover 31 on the opposite side of the lens unit 31a is inserted into a hole 1a of the board 1, a caulking portion 31c is formed through thermal caulking. The bottom side wall of the lens unit 31a is made in contact with a distal end surface 32c of the reflection plate 32 and one side surface 1b of the board 1. These surfaces 32c and 1b are applied with adhesive agent if necessary for bonding them to the lens unit 31a.

In operation of the LED array 30 constructed as above, a light beam 34 emanated from the LED chip 2 is reflected by the inner surface of the reflection plate 32 and guided in the main illumination direction 35, i.e., the light beam 34 is guided along the surface of the board 1. As particularly shown in FIG. 1(b), the LED array 30 has a small cross sectional area on the surface perpendicular to the main illumination direction 35.

In the embodiment shown in FIGS. 1(a) and 1(b), the light beam 34 from the LED chip 2 is reflected by the reflection plate 32. This reflection plate 32 may be omitted if desired. In such a case, a light beam from the LED chip 2 is condensed in the main illumination direction only by the function of the lens unit 31a. In contrast with this, the lens unit 31 may be omitted and the reflection plate 32 is used.

The following advantageous effects can be obtained by the above-described embodiment.

Figure 2:
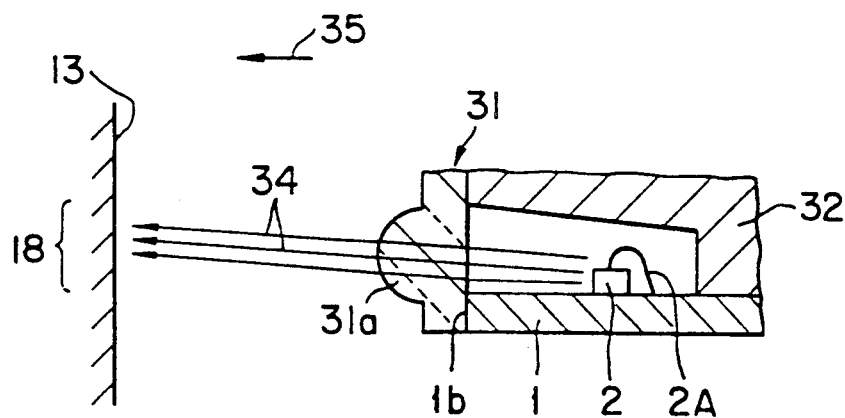
FIG. 2 illustrates the operation of the LED array shown in FIGS. 1(a) and 1(b)

Although it has been impossible heretofore, the embodiment allows to provide a reflection surface of the reflection plate 32 at the back of the LED chips 2. Accordingly, as seen from FIG. 2, irrespective of a small aperture area, a light beam from the LED chip 2 can be correctly directed in the main illumination direction 35 and properly applied to an effective illumination area 18.

Figure 3:
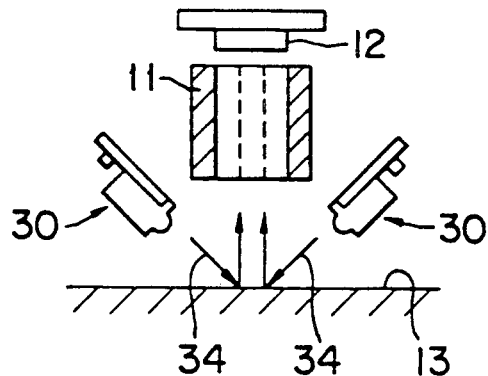
FIG. 3 shows a part of an apparatus mounting the LED arrays of the embodiment shown in FIGS. 1(a) and 1(b)

Therefore, using a contact type sensor shown in FIG. 3, the illuminance at the illuminating surface (original surface) can be made about 1.3 to 1.5 time as large as conventional, under an ordinary operating condition. In contrast with this, if a conventional illuminance is sufficient, the number of LED chips can be reduced, greatly lowering the cost of an LED array.

Figure 4:
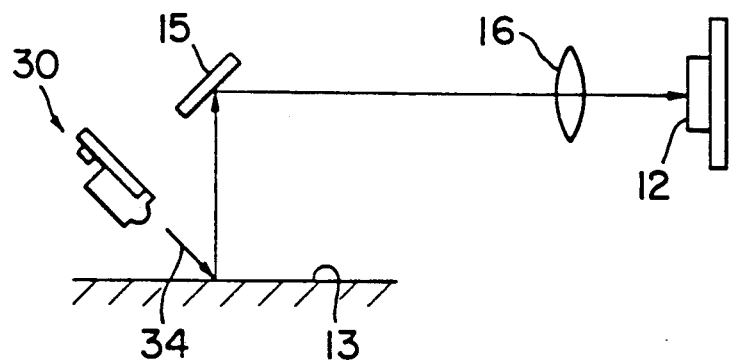
FIG. 4 shows a part of another apparatus mounting the LED array of the embodiment shown in FIGS. 1(a) and 1(b)

Furthermore, since the cross sectional area of an LED array is small on the surface perpendicular to the main illumination direction, a contact type sensor and a lens condensing type sensor can be made small, as shown in FIGS. 3 and 4. Particularly in the case of the lens condensing type sensor shown in FIG. 4, the LED array 30 can be mounted very easily at the position where the optical path is not intercepted.

Figure 5:
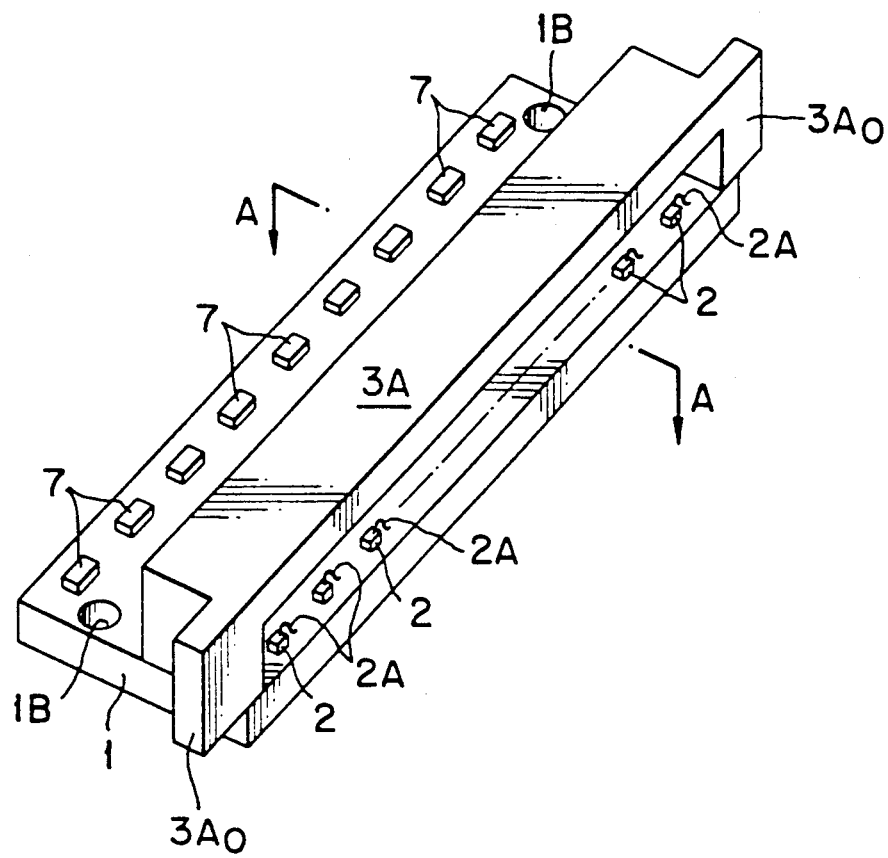
FIG. 5 is a perspective view of an LED array according to another embodiment of the present invention.
Figure 6:
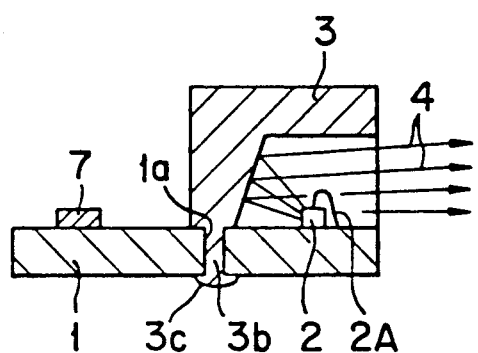
FIG. 6 is a cross section taken along line A—A of FIG. 5.

FIGS. 5 and 6 show another embodiment of an LED array according tot he present invention. FIG. 5 is a perspective view of the LED array, and FIG. 6 is a cross section taken along line A—A of FIG. 5. The difference of the LED array from the above-described embodiment resides in thé configuration of a reflection plate 3. The lateral cross section of the reflection plate 3 is generally of an L-character shape. A plurality of legs (points) $3b$ are formed on the bottom edge of the reflection plate 3 at a predetermined interval. The reflection plate 3 and a board 1 are bonded together by inserting the legs $3b$ into holes $1a$ of the board 1 and thermally caulking the legs $3b$. The reflection plate 3 is formed with mount guides $3A_0$ and $3A_0$ at opposite longitudinal sides thereof. Using the guides $3A_0$ and $3A_0$, the LED array is mounted within a casing of a bar code reader.

The following advantageous effects can be obtained by this embodiment.

(1) The main illumination direction is parallel with the surface of the board so that the LED array is made thin.

(2) The LED array of this embodiment can have a reflection wall even at the back of the LED chip in the main illumination direction. Accordingly, a light beam reflected by the reflection wall can be efficiently directed within the effective illumination area.

(3) The reflection plate is formed with the mount guides, e.g., each having a thickness of 1.6 mm and extending outside of the printed circuit board by 1 mm. Therefore, the printed circuit board itself is not required to be used for mounting the LED array to an apparatus, as conventional, thereby allowing to mount the LED array on a thin apparatus having a small mounting space (such as a bar code reader).

What is claimed is:

1. An LED array comprising:
   a printed circuit board;
   a plurality of LED chips disposed linearly on said printed circuit board, each LED chip being capable of radiating a light beam; and
   a reflection member for reflecting each said light beam from said LED chips, guiding each said light beam outward of said LED array in a main illumination direction generally parallel to the surface of said board.

2. An LED array according to claim 1, wherein said reflection member has a reflection surface which reflects said light beam in the main illumination direction, said light beam being radiated from the LED chips in the direction reverse to said main illumination direction.

3. An LED array according to claim 1, wherein said reflection member is formed in an elongated shape and has a lateral cross section generally of an L-character shape.

4. An LED array according to claim 2, wherein said reflection member is formed in an elongated shape and has a lateral cross section generally of an L-character shape.

5. An LED array according to claim 3, wherein one side of said reflection member is fixedly mounted on said board generally perpendicularly, and the other side of said reflection member is positioned above said LED chips.

6. An LED array according to claim 4, wherein one side of said reflection member is fixedly mounted on said board generally perpendicularly, and the other side of said reflection member is positioned above said LED chips.

7. An LED array according to claim 5, wherein an opening is defined between said one side of said reflection member, said other side of said reflection member and said board.

8. An LED array according to claim 7, wherein there is mounted lens means in front of said reflection member, said lens means guiding said light beam from said LED outward of said LED array in said main illumination direction generally parallel to the surface of said board.

9. An LED array according to claim 8, wherein there is mounted lens means in front of said reflection member, said lens means guiding each said light beam from said LED outward of said LED array in said main illumination direction generally parallel to the surface of said board.

10. An LED array according to claim 8, wherein said lens means constitutes a part of a cover covering the whole of said reflection member.

11. An LED array according to claim 10, wherein said lens means constitutes a part of a cover covering the whole of said reflection member.

12. An LED array according to claim 10, wherein current limiting resistors for said LED chips are mounted on said board.

13. An LED array according to claim 11, wherein current limiting resistors for said LED chips are mounted on said board.

14. An LED array according to claim 10, wherein said reflection member is formed with mount guides at opposite longitudinal sides thereof.

15. An LED array according to claim 11, wherein said reflection member is formed with mount guides at opposite longitudinal sides thereof.

16. An LED array according to claim 9, wherein the optical axis of said lens means is set apart from an axis passing through the center of said LED chip in said main illumination direction, relative to the surface of said board.

17. An LED array according to claim 11, wherein the optical axis of said lens means is set apart from an axis passing through the center of said LED chip in said main illumination direction, relative to the surface of said board.

18. An LED array according to claim 13, wherein the optical axis of said lens means is set apart from an axis passing through the center of each said LED chip in said main illumination direction, relative to the surface of said board.

19. An LED array according to claim 15, wherein the optical axis of said lens means is set apart from an axis passing through the center of each said LED chip in said main illumination direction, relative to the surface of said board.

* * * * *